(12) United States Patent
Huang et al.

(10) Patent No.: US 11,818,915 B2
(45) Date of Patent: Nov. 14, 2023

(54) DISPLAY BACKBOARD, DISPLAY PANEL AND METHOD OF MANUFACTURING THE SAME, AND DISPLAY APPARATUS

(71) Applicant: BOE TECHNOLOGY GROUP CO., LTD., Beijing (CN)

(72) Inventors: Haitao Huang, Beijing (CN); Shi Shu, Beijing (CN); Yong Yu, Beijing (CN); Xiang Li, Beijing (CN); Yang Yue, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 193 days.

(21) Appl. No.: 16/915,014

(22) Filed: Jun. 29, 2020

(65) Prior Publication Data
US 2021/0159463 A1    May 27, 2021

(30) Foreign Application Priority Data

Nov. 27, 2019    (CN) .......................... 201911197339.4

(51) Int. Cl.
*H10K 50/856* (2023.01)
*H10K 50/858* (2023.01)
(Continued)

(52) U.S. Cl.
CPC ......... *H10K 50/856* (2023.02); *H10K 50/858* (2023.02); *H10K 59/122* (2023.02); *H10K 71/00* (2023.02); *H10K 59/1201* (2023.02)

(58) Field of Classification Search
CPC . H01L 51/5271; H01L 51/5275; H01L 51/56; H01L 27/3246; H01L 2227/323;
(Continued)

(56) References Cited

U.S. PATENT DOCUMENTS 9,825,106 B2    11/2017  Li et al.
2016/0013167 A1*  1/2016  Sakariya ............. H01L 25/0753
257/88
(Continued)

FOREIGN PATENT DOCUMENTS

CN    105552249 A    5/2016
CN    109037476 A    12/2018
(Continued)

OTHER PUBLICATIONS

Notice of Allowance issued in corresponding Chinese Patent Application No. 201911197339.4, dated Nov. 3, 2021.

*Primary Examiner* — Shaun M Campbell
(74) *Attorney, Agent, or Firm* — McDermott Will & Emery LLP

(57) ABSTRACT

A display backboard, a display panel and a method of manufacturing the same, and a display apparatus are provided. The display backboard includes a base substrate, a thin film transistor array layer on a surface of the base substrate, a flattening layer on a side of the thin film transistor array layer away from the base substrate, and a pixel-defining layer on a surface of the flattening layer away from the base substrate; wherein the pixel-defining layer comprises a first pixel-defining layer, the first pixel-defining layer defines a plurality of first openings, at least a portion of a sidewall of each first opening is provided with a reflective layer.

11 Claims, 10 Drawing Sheets

(51) Int. Cl.
*H10K 59/122* (2023.01)
*H10K 71/00* (2023.01)
*H10K 59/12* (2023.01)

(58) Field of Classification Search
CPC .. H10K 50/856; H10K 50/858; H10K 59/122; H10K 59/1201; H10K 70/00
See application file for complete search history.

(56) References Cited

U.S. PATENT DOCUMENTS

| | | | |
|---|---|---|---|
| 2016/0359142 A1* | 12/2016 | Huangfu | H01L 51/001 |
| 2017/0271418 A1 | 9/2017 | Li et al. | |
| 2019/0019993 A1* | 1/2019 | Narutaki | H01L 27/3276 |
| 2019/0198782 A1* | 6/2019 | Kim | H01L 27/1248 |
| 2020/0035770 A1* | 1/2020 | Jiang | H01L 27/3283 |
| 2020/0083484 A1* | 3/2020 | Lee | H01L 27/3246 |
| 2021/0273202 A1 | 9/2021 | Liu et al. | |

FOREIGN PATENT DOCUMENTS

| | | | | |
|---|---|---|---|---|
| CN | 110085655 A | | 8/2019 | |
| CN | 110212004 A | | 9/2019 | |
| CN | 110444691 A | * | 11/2019 | H01L 51/56 |
| CN | 110444691 A | | 11/2019 | |

* cited by examiner

DISPLAY BACKBOARD, DISPLAY PANEL AND METHOD OF MANUFACTURING THE SAME, AND DISPLAY APPARATUS

CROSS-REFERENCE TO RELATED APPLICATION

This application claims priority of Chinese Patent Application No. 201911197339.4 filed on Nov. 27, 2019 in China National Intellectual Property Administration, the disclosure of which is incorporated herein by reference in entirety.

TECHNICAL FIELD

The present disclosure relates to the field of display technology, and in particular, to a display backboard, a display panel and a method of manufacturing the same, and a display apparatus.

BACKGROUND

At present, display panels are gradually trending towards smaller size displays, such as in the AR field. It is foreseeable that for smaller display technologies, higher brightness products will be required in the future. However, in the related art, the display brightness of the display backboard is still low.

SUMMARY

According to an aspect of the present disclosure, there is provided a display backboard, comprising: a base substrate, a thin film transistor array layer on a surface of the base substrate, a flattening layer on a side of the thin film transistor array layer away from the base substrate, and a pixel-defining layer on a surface of the flattening layer away from the base substrate; wherein the pixel-defining layer comprises a first pixel-defining layer, the first pixel-defining layer defines a plurality of first openings, at least a portion of a sidewall of each first opening is provided with a reflective layer.

In some embodiments, the pixel-defining layer further comprises a second pixel-defining layer, the second pixel-defining layer is on exposed surfaces of the reflective layer and the first pixel-defining layer.

In some embodiments, the entire sidewall of each first opening is provided with the reflective layer.

In some embodiments, a surface of the first pixel-defining layer away from the base substrate is also provided with the reflective layer.

In some embodiments, the reflective layer meets at least one of the following conditions: a material forming the reflective layer comprises at least one of silver, aluminum, and magnesium; and a thickness is 0.1 μm~1 μm.

According to another aspect of the present disclosure, there is provided a display panel, comprising the display backboard mentioned above.

In some embodiments, the display panel further comprises:
a plurality of microlenses provided on a side of the first pixel-defining layer of the display backboard away from the base substrate, and surfaces of the plurality of microlenses away from the display backboard are a curved surface convex away from the display backboard, the first pixel-defining layer defines a plurality of first openings, and an orthographic projection of at least one of the first openings on the base substrate at least partially overlaps with orthographic projections of the plurality of microlenses on the base substrate.

In some embodiments, the display panel further comprises:
a plurality of barriers provided on a side of the first pixel-defining layer away from the base substrate, adjacent ones of the barriers define a plurality of second openings, and the plurality of microlenses are provided in the plurality of second openings.

In some embodiments, at least one of the microlenses meets at least one of the following conditions:

$$f = \frac{n_1 r}{n_2 - n_3} \text{ and } r = \frac{f*(n_2 - n_3)}{n_1};$$

$$n_3 = n_2 - \frac{r*n_1}{f} \text{ and } n_2 - n_3 = \frac{r*n_1}{f};$$

$$\Delta n = \frac{r*n_1}{f};$$

$$r \geq \frac{D}{2};$$

$$\Delta n = \frac{r*n_1}{f} \geq \frac{n_1 * D}{2f},$$

where, f is a focal length of the microlens, $n_1$ is an average refractive index of all structures on a side of the microlens close to the display backboard, and $n_2$ is a refractive index of a material forming the microlens, $n_3$ is a refractive index of a structure on a surface of the microlens away from the display backboard, r is a curvature radius of the curved surface, D is a caliber of the microlens, and Δn is a difference between $n_2$ and $n_3$.

According to another aspect of the present disclosure, there is provided a method of manufacturing the display panel mentioned above, the method comprising a step of forming the display backboard, wherein the step of forming the display backboard comprises:
forming the thin film transistor array layer on a surface of the base substrate;
forming the flattening layer on the side of the thin film transistor array layer away from the base substrate;
forming the first pixel-defining layer on the surface of the flattening layer away from the base substrate, the first pixel-defining layer defining the plurality of first openings; and
forming the reflective layer at least at a portion of the sidewall of each first opening.

In some embodiments, the step of forming the display backboard further comprises:
forming a second pixel-defining layer on exposed surfaces of the reflective layer and the first pixel-defining layer.

In some embodiments, after the step of forming the display backboard, the method further comprises:
forming, by an inkjet printing process, a plurality of microlenses on a side of the first pixel-defining layer away from the base substrate.

In some embodiments, the step of forming a plurality of microlenses further comprises:
implementing a hydrophilic treatment on a surface where the microlenses to be formed;
forming a plurality of barriers on the surface where the microlenses to be formed, adjacent ones of the barriers defining a plurality of second openings; and forming the plurality of microlenses in the plurality of second openings, respectively.

In some embodiments, the hydrophilic treatment comprises an ashing treatment.

According to another aspect of the present disclosure, there is provided a display apparatus comprising the display panel mentioned above.

DETAILED DESCRIPTION OF EMBODIMENTS

This disclosure is based on the inventor's following findings.

In the related art, most of the light emitted by the light-emitting elements in the display backboard will be emitted by the pixel unit in the display backboard perpendicular to the display backboard, but some of the light will still deviate from the direction perpendicular to the display backboard and enter the pixel-defining layer of the display backboard, light leakage is formed. Specifically, the light emitted by the light-emitting element in the display backboard may be transmitted along the anode surface of the light-emitting element in the display backboard (that is, in a direction parallel to the display backboard), and finally enter the pixel-defining layer of the display backboard, and outward light leakage occurs along the pixel-defining layer; or it may be light emitted by the light-emitting element, which directly enters the pixel-defining layer to generate a waveguide effect, and outward light leakage occurs along the pixel-defining layer, thereby causing technical problems that the display backboard has a low utilization rate of light emitted by the light-emitting element and insufficient display brightness.

Based on this, the present disclosure aims to solve one of the technical problems in the related art at least to a certain extent. To this end, an object of the present disclosure is to propose a display backboard, which is less prone to side light leakage, has a lower production cost, has a higher utilization rate of light emitted by a light-emitting element, has a high display brightness, has a good display effect, or is particularly suitable for use in small-sized display such as the AR field.

The embodiments of the present disclosure are described in detail below. The embodiments described below are exemplary and are only used to explain the present disclosure, and should not be construed as limiting the present disclosure. If no specific technology or conditions are indicated in the examples, the technology or conditions described in the literature in the art or the product specification shall be followed.

Figure 1:
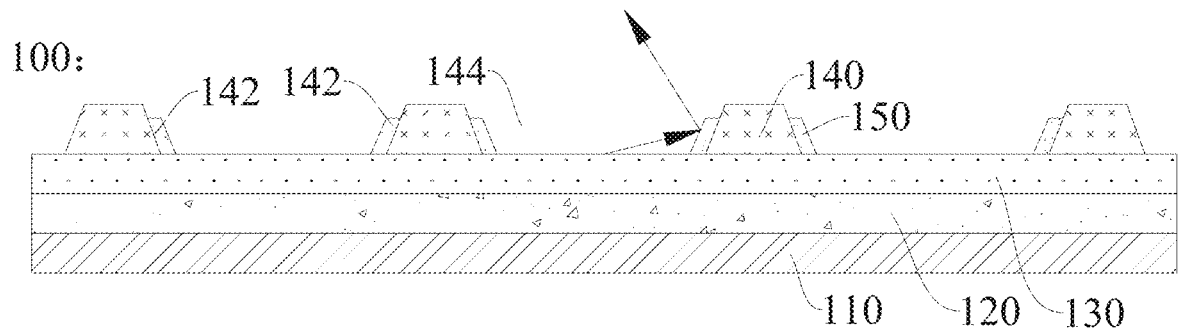
FIG. 1 shows a schematic cross-sectional structure diagram of a display backboard according to an embodiment of the present disclosure.

In one aspect of the present disclosure, the present disclosure provides a display backboard. According to an embodiment of the present disclosure, referring to FIG. 1, the display backboard comprises: a base substrate 110, a thin film transistor array layer 120 on a surface of the base substrate 110, a flattening layer 130 on a side of the thin film transistor array layer 120 away from the base substrate 110, and a pixel-defining layer on a surface of the flattening layer 130 away from the base substrate 110; wherein the pixel-defining layer comprises a first pixel-defining layer 140, the first pixel-defining layer 140 defines a plurality of first openings 144, at least a portion of a sidewall 142 of the first opening 144 is provided with a reflective layer 150. In the display backboard 100, although a part of the light will deviate from the direction perpendicular to the display backboard 100 and hit the pixel-defining layer, after hitting the pixel-defining layer, this part of the light will be reflected on the surface of the reflective layer 150, so that this part of the light is reflected back to the direction substantially perpendicular to the display backboard 100 and exits the display backboard 100 (as shown by the arrow in FIG. 1), so that the display backboard 100 is less prone to side light leakage, and the production cost is lowered, the light-emitting element has a high utilization rate of light, a high display brightness, and a good display effect, and is particularly suitable for small-sized displays such as the AR field.

According to an embodiment of the present disclosure, the material forming the reflective layer 150 may include silver, aluminum, magnesium and the like. Therefore, the light reflectivity of the reflective layer 150 is high, so that most of the light irradiated on the surface of the reflective layer 150 can be reflected, so that it can be emitted out of the display backboard 100 in a direction substantially perpendicular to the display backboard 100. At the same time, the materials are widely available, easily available, and at low cost.

According to an embodiment of the present disclosure, the thickness of the reflective layer 150 may be 0.1 μm to 1 μm, specifically, may be 0.1 μm, 0.2 μm, 0.4 μm, 0.6 μm, 0.8 μm, 1 μm, or the like. Therefore, the thickness of the reflective layer 150 is a relatively suitable thickness, which can further increase the reflectivity of the light, thereby further reflecting most of the light irradiated on the surface of the reflective layer 150 to further improve the display effect.

According to an embodiment of the present disclosure, the shape of the pixel-defining layer is not particularly limited, as long as the light irradiated to the surface of the reflective layer 150 can be reflected back in a direction substantially perpendicular to the display backboard 100 and exit the display backboard 100. For example, referring to FIGS. 1 to 4, in some embodiments of the present disclosure, the shape of the cross-section of the pixel-defining layer may be trapezoidal, and the width of the first opening 144 from the base substrate 110 to the base substrate 110 gradually decreases. Tus, the reflective layer 150 can better reflect the light irradiated onto the surface thereof, and make the light exit the display backboard 100 in a direction substantially perpendicular to the display backboard 100.

According to an embodiment of the present disclosure, the material forming the first pixel-defining layer 140 may be a material conventionally used to define pixels in the art, and its transparency is not particularly limited, and will not be repeated here.

According to the embodiments of the present disclosure, those skilled in the art may understand that the display backboard 100 may also include other structures of conventional display backboard 100, and the aforementioned base substrate 100, thin film transistor array layer 120, and flattening layer 130 may all have the thickness of the corresponding structure in the conventional display backboard, the forming material, etc., which will not be repeated here.

Figure 2:
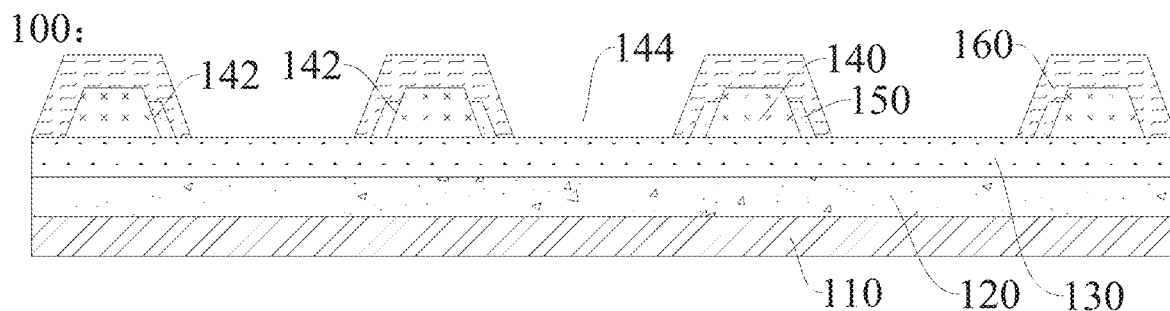
FIG. 2 shows a schematic cross-sectional structure diagram of a display backboard according to another embodiment of the present disclosure.

According to an embodiment of the present disclosure, further referring to FIG. 2, the display backboard 100 further comprises a second pixel-defining layer 160, and the second pixel-defining layer 160 is on exposed surfaces of the reflective layer 150 and the first pixel-defining layer 140. Since the material for forming the reflective layer 150 can be a material with high reflectivity, and most of the materials with high reflectivity are relatively conductive materials (such as metal), if the reflective layer 150 is directly in contact with the anode or cathode of the light-emitting element in the display backboard 100, the short circuit will occur. Therefore, the exposed surfaces of the reflective layer 150 and the first pixel-defining layer 140 have the second pixel-defining layer 160, which can prevent the reflective layer 150 from being exposed to the pixel-defining layer to be in contact with the anode or cathode, so that a short circuit is unlikely to occur in the display backboard 100, and no additional insulating layer is needed to prevent short circuit. The structure is simple, the cost is low, and it is easy to industrialize.

According to an embodiment of the present disclosure, the material forming the second pixel-defining layer 160 may include a material with high transparency, so that most of the light emitted by the light-emitting element of the display backboard 100 is irradiated onto the surface of the reflective layer 150, and no waveguide effect will occur inside the second pixel-defining layer 160, so that it is better reflected by the reflective layer 150 and exits the display backboard 100 in a direction substantially perpendicular to the display backboard 100.

Figure 3:
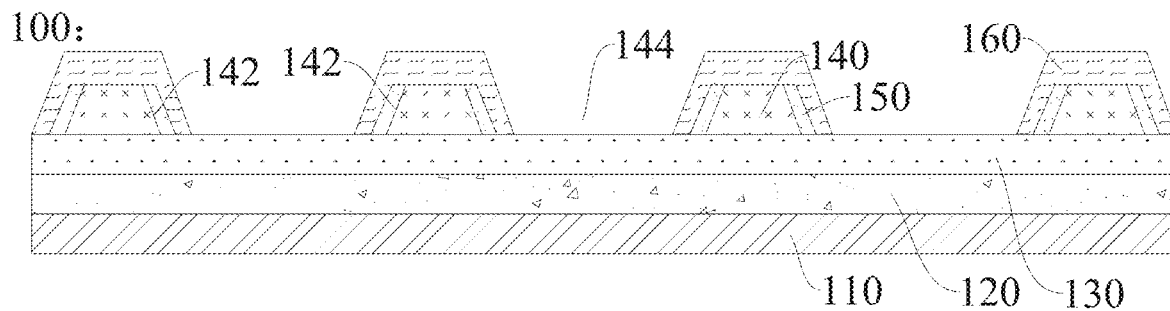
FIG. 3 shows a schematic cross-sectional structure diagram of a display backboard according to yet another embodiment of the present disclosure.

According to an embodiment of the present disclosure, still referring to FIG. 3, the entire sidewall 142 of the first opening 144 is provided with the reflective layer 150. Thus, when the light emitted by the light-emitting element in the display backboard 100 is irradiated on any part of the side wall 142 of the pixel-defining layer, the reflective layer 150 can play a role in reflecting light, thereby further making that the display backboard 100 is less prone to side light leakage, the utilization rate of the light emitted by the light-emitting element is higher, the display brightness is higher, and the display effect is better.

Figure 4:
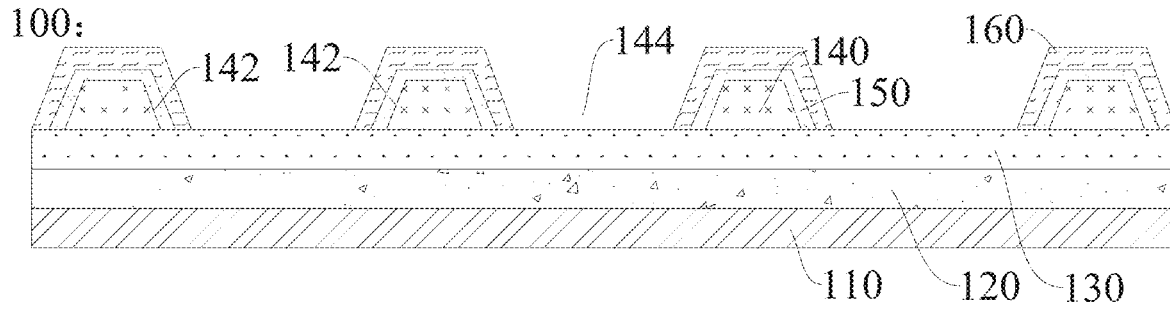
FIG. 4 shows a schematic cross-sectional structure diagram of a display backboard according to still another embodiment of the present disclosure.

According to an embodiment of the present disclosure, further referring to FIG. 4, the surface of the first pixel-defining layer 140 away from the base substrate 110 is also provided with the reflective layer 150. Therefore, the reflective layer 150 can be formed directly on the surface of the first pixel-defining layer 140 without additional steps (such as using a mask to cover the part that does not need to form the reflective layer 150). The process is simple and the cost is low, and it is easy to manufacture and easy to realize industrialization.

In another aspect of the present disclosure, the present disclosure provides a display panel. According to an embodiment of the present disclosure, the display panel includes the aforementioned display backboard. Referring to FIG. 1 to FIG. 4, although in the display backboard 100, a part of the light will deviate from the direction perpendicular to the display backboard 100 and hit the pixel-defining layer, after hitting the pixel-defining layer, this part of the light will be reflected on the surface of the reflective layer 150, so that this part of the light is reflected back to the direction substantially perpendicular to the display backboard 100 and exits the display backboard 100, so that the display panel including the display backboard 100 has a high display brightness, and a good display effect, and is particularly suitable for small-sized displays such as the AR field.

Figure 5:
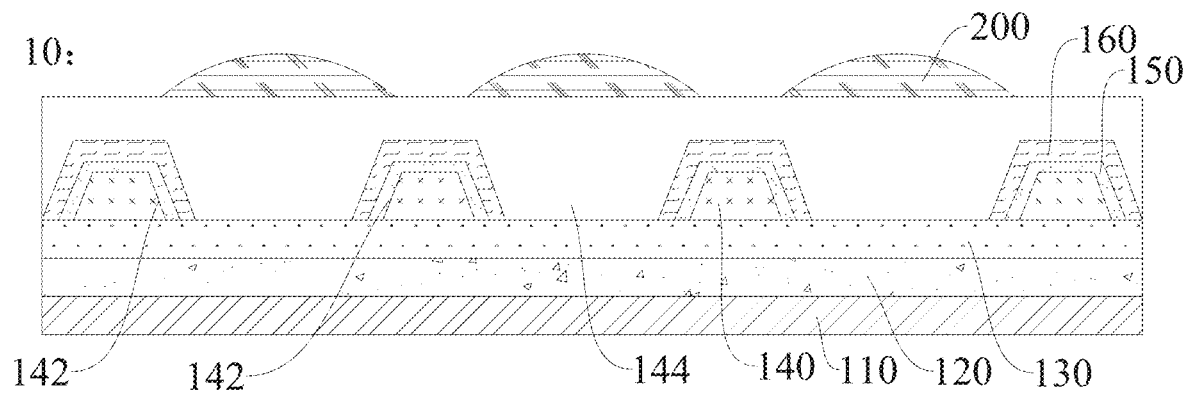
FIG. 5 shows a schematic cross-sectional structure diagram of a display panel according to an embodiment of the present disclosure.

According to an embodiment of the present disclosure, referring to FIG. 5, the display panel further comprises: a plurality of microlenses 200 provided on a side of the first pixel-defining layer 140 of the display backboard away from the base substrate 110, and surfaces of the plurality of microlenses 200 away from the display backboard are a curved surface convex away from the display backboard, the first pixel-defining layer 140 defines a plurality of first openings 144, and an orthographic projection of at least one of the first openings 144 on the base substrate 110 at least partially overlaps with orthographic projections of the plurality of microlenses 200 on the base substrate, respectively. Therefore, the curved surface of the microlens 200 can converge the light emitted by the light-emitting element of the display backboard, thereby increasing the intensity of the light of the positive viewing angle of the display panel 10. The inventors have tested after a large number of experiments that the microlens 200 can increase the display brightness of the display backboard's positive viewing angle to about twice the original, so it has high display brightness and good display effect. The display panel is especially suitable for AR display technology of holographic optical waveguide.

According to an embodiment of the present disclosure, in FIGS. 5 and 6 herein, and FIGS. 15f and 15g in the following, those skilled in the art may understand that the white area between the microlens 200 and the pixel-defining layer may represent structure of a conventional display panel, for example, it may be an encapsulation structure, which will not be repeated in the following.

According to the embodiments of the present disclosure, further, those skilled in the art may understand that the orthographic projection of the first openings 144 on the base substrate 110 described above corresponds to the positions of the plurality of microlens 200 in one-to-one correspondence. Each microlens 200 may also cover a whole first opening 144, so that the display brightness of the positive viewing angle of the display panel is further improved, the display brightness is further improved, and the display effect is further improved.

Figure 6:
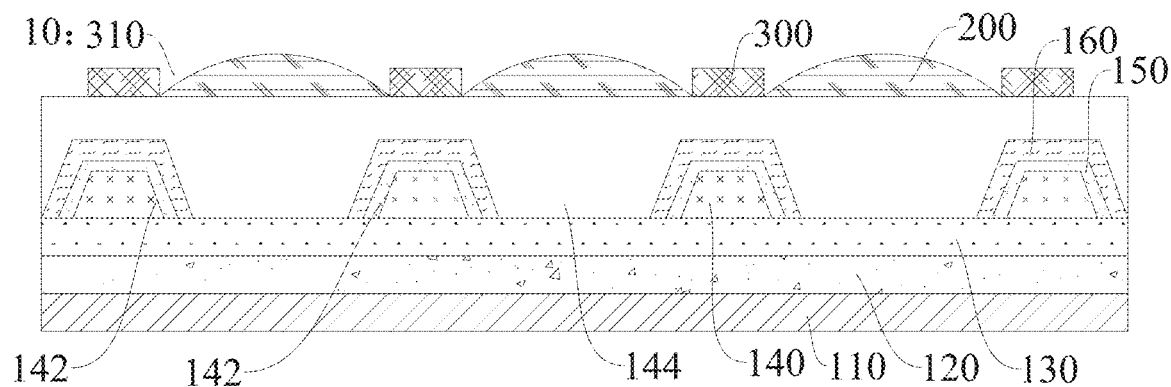
FIG. 6 shows a schematic cross-sectional structure diagram of a display panel according to another embodiment of the present disclosure.

According to an embodiment of the present disclosure, referring to FIG. 6, the display panel 10 further comprises: a plurality of barriers 300 provided on a side of the first pixel-defining layer 140 away from the base substrate 110, adjacent ones of the barriers 300 define a plurality of second openings 310, and the plurality of microlenses 200 are respectively provided in the plurality of second openings 310.

The plurality of the microlenses 200 correspond to the positions of the first openings 144 of the light-emitting elements in the display backboard, and the light emitted by each of the first openings can be incident on exactly one of the microlenses 200. Thereby, the light emitted by the display backboard has a good convergence effect, and the brightness of the positive viewing angle of the display panel 10 is further improved, so that the display brightness is high and the display effect is good.

According to an embodiment of the present disclosure, the material forming the barriers 300 may be a material with high hydrophobicity, such as Teflon or acrylic resin. As a result, materials are widely available, easily available, and cost-effective.

According to an embodiment of the present disclosure, the color of the barriers 300 is not particularly limited, and specifically, it may be black or white. Therefore, the presence of the barriers 300 does not easily affect the display effect of the display panel.

Figure 7A:
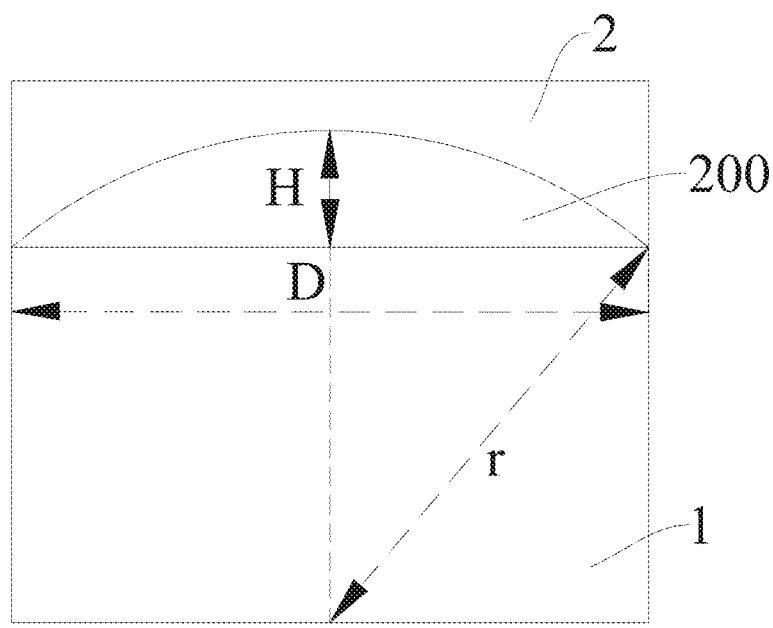
FIG. 7a shows a schematic cross-sectional structure diagram of a microlens in an embodiment of the present disclosure.
Figure 7B:
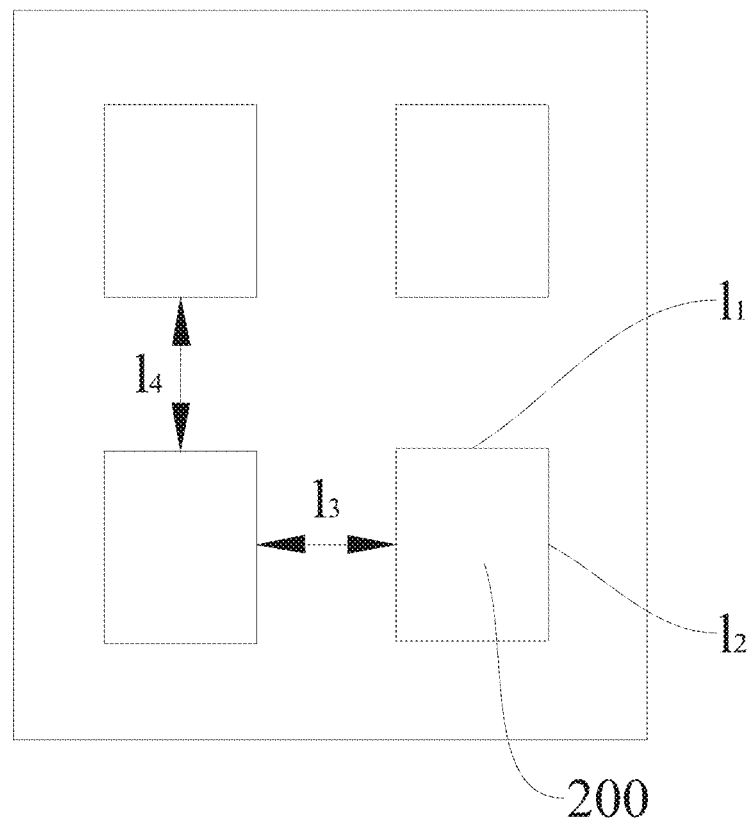
FIG. 7b shows a schematic plan view of the micro lens in the embodiment of the present disclosure.

According to an embodiment of the present disclosure, referring to FIG. 7, in the plurality of the microlenses 200, at least one of the microlenses 200 meets at least one of the following conditions:

$$f = \frac{n_1 r}{n_2 - n_3} \text{ and } r = \frac{f*(n_2 - n_3)}{n_1};$$

$$n_3 = n_2 - \frac{r*n_1}{f} \text{ and } n_2 - n_3 = \frac{r*n_1}{f};$$

$$\Delta n = \frac{r*n_1}{f};$$

$$r \geq \frac{D}{2};$$

$$\Delta n = \frac{r*n_1}{f} \geq \frac{n_1*D}{2f},$$

where, f is a focal length of the microlens, $n_1$ is an average refractive index of all structures on a side of the microlens close to the display backboard, and $n_2$ is a refractive index of a material forming the microlens, $n_3$ is a refractive index of a structure on a surface of the microlens away from the display backboard, r is a curvature radius of the curved surface, D is a caliber of the microlens, and $\Delta n$ is a difference between $n_2$ and $n_3$. As a result, the microlens satisfies the above relationship, which can further improve the convergence of light.

According to an embodiment of the present disclosure, the average refractive index of all structures on the side of the microlens close to the display backboard specifically refers to: the average value of the refractive indexes of all layers on the side of the microlens close to the display backboard, for example, including the base substrate, the thin film transistor array layer, the flattening layer, the pixel-defining layer, etc., the sum of the refractive indexes of the forming materials of multiple structures and components is divided by the number of multiple structures. Specifically, it may refer to the sum of the refractive index of the material forming the base substrate, the refractive index of the material forming the thin film transistor array layer, the refractive index of the material forming the flattening layer, and the refractive index of the material forming the pixel-defining layer divided by 4, which is the aforementioned average refractive index $n_1$.

According to an embodiment of the present disclosure, the refractive index of the structure on the surface of the microlens away from the display backboard specifically refers to: the refractive index of the surface of the microlens away from display backboard and the material that is in close contact with the microlens, for example, in the display panel, a cover plate can usually be formed on the surface of the microlens away from the display backboard, and the aforementioned refractive index $n_3$ is the refractive index of the material forming the cover plate.

According to an embodiment of the present disclosure, in the microlens 200, the value of f ranges from 8 μm to 30 μm, specifically, it may be 8 μm, 12 μm, 17.5 μm, 22 μm, 24 μm, or 30 μm. The value of $n_1$ ranges from 1.2 to 1.6, specifically, it can be 1.2, 1.3, 1.4, 1.5, 1.6; the value of $n_2$ ranges from 1.5 to 1.8, specifically, it can be 1.5, 1.6, 1.68, or 1.8; The value of $n_3$ ranges from 1.0 to 1.5, specifically, it can be 1.0, 1.1, 1.2, 1.3, 1.4 or 1.5, etc.; the value of r ranges from 2 μm to 15 μm, specifically, it can be 2 μm, 4 m, 6 μm, 8 μm, 10 μm, 12 μm or 15 μm, etc.; the value of D ranges from 2 μm to 15 μm, specifically, it can be 2 μm, 4 μm, 6 μm, 8 μm, 10 μm, 12 μm or 15 μm, etc.; the value of Δn ranges from 0.1 to 0.5, specifically, it can be 0.1, 0.2, 0.3, 0.4, or 0.5, etc.; the value of the arch height H ranges from 1 μm to 5 μm, specifically, it can be 1 μm, 2 μm, 3 μm, 4 μm, 5 μm, etc. Therefore, the microlens 200 can better achieve the convergence of the light emitted by the light-emitting element in the display backboard.

Figure 10:
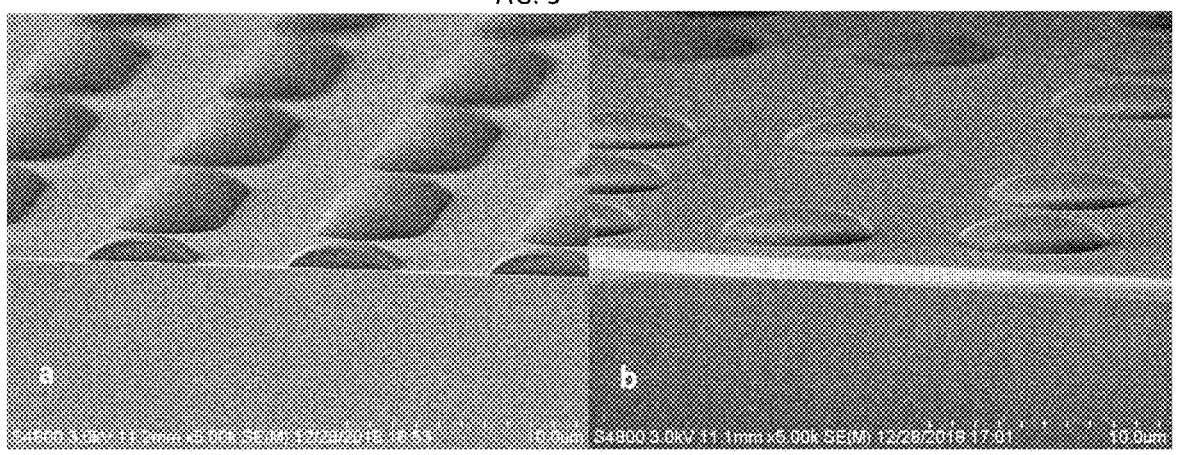
FIG. 10 respectively show in pictures a and b scanning electron micrographs of microlens of different shapes in the display panel of the present disclosure.
Figure 11:
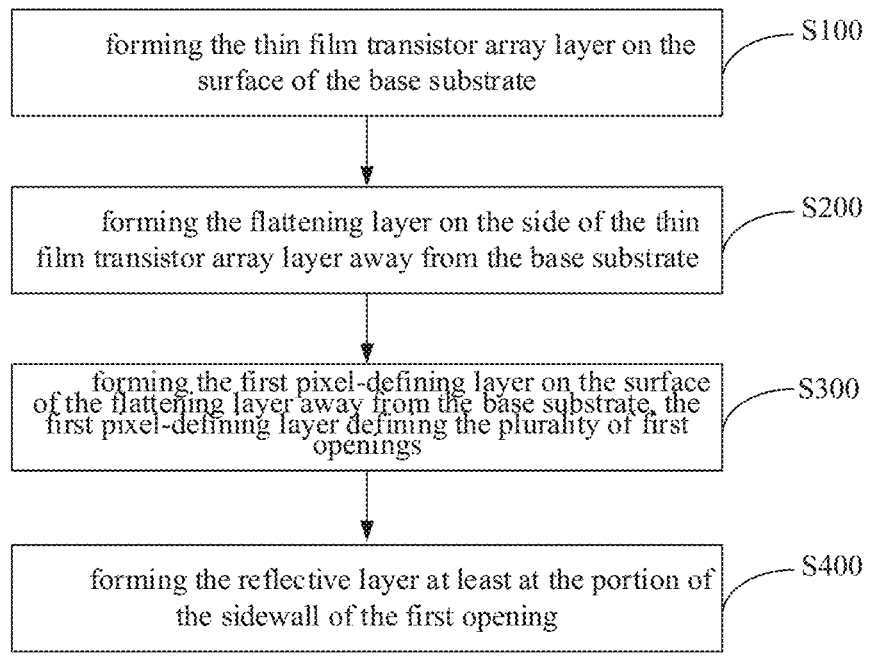
FIG. 11 shows a schematic flowchart of a method for manufacturing a display panel according to an embodiment of the present disclosure.

According to an embodiment of the present disclosure, the shape of the planar structure of the microlens 200 is not particularly limited. For example, in some embodiments of the present disclosure, the shape of the planar structure of the microlens 200 may be circular (refer to picture b in FIG. 10), ellipse, and may also be irregular figures (refer to picture a in FIG. 10). In some other embodiments of the present disclosure, referring to FIG. 7b, the shape of the planar structure of the microlens 200 may also be a rectangle, the rectangle has a first side 11 and a second side 12 that are perpendicular to each other and a third side parallel to the side 11 and a fourth side parallel to the second side 12. In some embodiments of the present disclosure, the length of the first side 11 may range from 8 μm to 12 μm, specifically, may be 8 μm, 9 μm, 10 μm, 11 μm, or 12 μm the length of the second side 12 may range from 8 μm to 12 μm, specifically, 8 μm, 9 μm, 10 μm, 11 μm, or 12 μm. Therefore, the size of the microlens 200 is more suitable, and it can play a better role in converging the light emitted by the light-emitting elements in the display backboard.

According to an embodiment of the present disclosure, the distance between the two adjacent microlens 200 is not particularly limited, and at the same time, the number of microlenses around one microlens 200 is not particularly limited. For example, in some embodiments of the present disclosure, referring to FIG. 7b, when the planar structure of the microlens 200 is rectangular and arranged in an array, there is a first spacing $l_3$ and a second spacing $l_4$ between two adjacent microlenses 200, the first spacing 13 is the distance between two adjacent microlenses in the direction of the long side of the rectangle, and the second spacing $l_4$ is the distance between two adjacent microlens in the direction of the short side of the rectangle. The value of the first spacing b ranges from 8 μm to 14 μm, specifically, it can be 8 μm, 9 μm, 10 μm, 11 μm, 12 μm, 13 μm or 14 μm etc.; the value of the second spacing $l_4$ ranges from 24 μm to 30 μm, specifically, it can be 24 μm, 25 μm, 26 μm, 27 μm, 28 μm, 29 μm or 30 μm, etc.; the number of the microlenses around the microlens 200 can be 4. Therefore, the arrangement between the plurality of microlenses 200 is more suitable, which can make it have a better convergence effect on the light emitted by the light emitting element in the display backboard. At the same time, the manufacturing process is relatively simple, the cost is low, and it is easy to achieve industrialization.

Figure 7C:
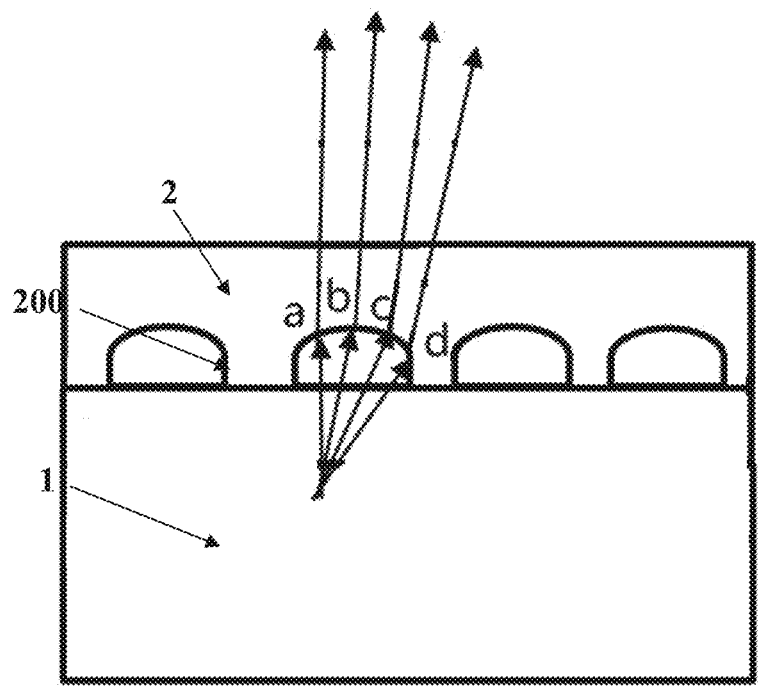
FIG. 7c shows a schematic diagram of the light focusing effect of the microlens in the embodiment of the present disclosure.

According to an embodiment of the present disclosure, specifically, referring to FIG. 7c, the light a, b, c, and d pass through the microlens 200 after being emitted from the light-emitting element in the display backboard, and the surface of the microlens 200 away from the display backboard is the curved surface convex away from the display backboard, has a converging effect on light a, b, c, and d, so that the display brightness of the display panel at a positive viewing angle is significantly improved.

According to an embodiment of the present disclosure, the material forming the microlens 200 may be a conventional ink material for inkjet printing, or a conventional photocurable material, such as NOA73 or the like. As a result, materials are widely available, easily available, and cost-effective.

Figure 8:
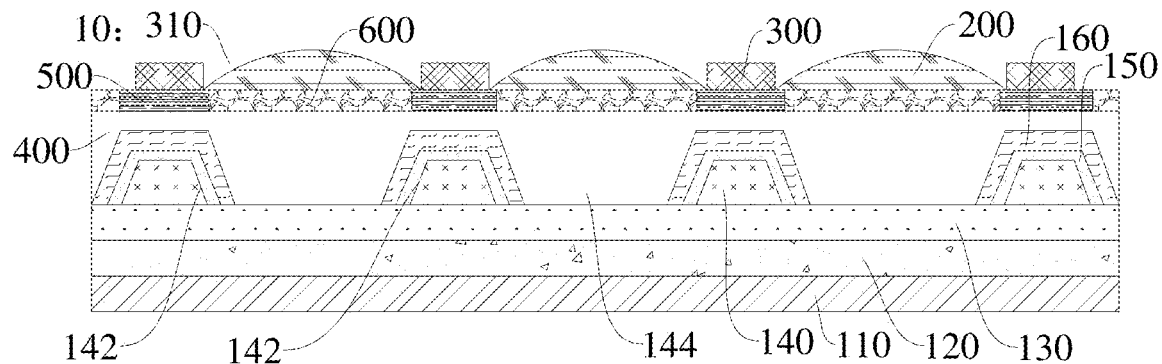
FIG. 8 shows a schematic cross-sectional structure diagram of a display panel according to yet another embodiment of the present disclosure.

In a specific embodiment of the present disclosure, referring to FIG. 8, further, in addition to the structure described above, the display panel 10 further includes: a packaging structure 400, which is provided on the surface of the display backboard in the display panel; a black matrix 500 and a color resist layer 600, wherein the black matrix 500 is disposed on the surface of the packaging structure 400 away from the base substrate 100 in the display panel 10, the black matrix 500 defines a plurality of third openings, and the color resist layer is disposed in the plurality of third openings, the orthographic projection of the third opening on the base substrate 110 at least partially overlaps with the orthographic projection of the first openings on the base substrate. Thus, the plurality of microlenses 200 at least partially overlaps with the plurality of color resist blocks in the color resist layer 600, so that in the display backboard of the display panel 10, light of the light-emitting element irradiates the color resist layer 600 and then directly into the microlens 200, so that most of the light can be better into the microlens 200, further improving the display brightness and display effect of the display panel 10.

According to an embodiment of the present disclosure, the color resist layer 600 may include a plurality of color resist blocks, specifically, may include a red color resist block, a green color resist block, a blue color resist block, etc. The specific structure and forming material of the color resist layer 600 and the black matrix 500 may be the structure and forming material of the conventional color block and the black matrix, which will not be repeated here.

According to an embodiment of the present disclosure, the packaging structure 400 may specifically be thin films formed of an organic material and thin films formed of an inorganic material alternately stacked in multiple layers, and the thickness thereof may be a conventional thickness of a packaging film in the art, which will not be repeated here.

According to the embodiments of the present disclosure, the thicknesses of other layer structures in the display panel may all be conventional thicknesses, which will not be repeated here.

Figure 9:
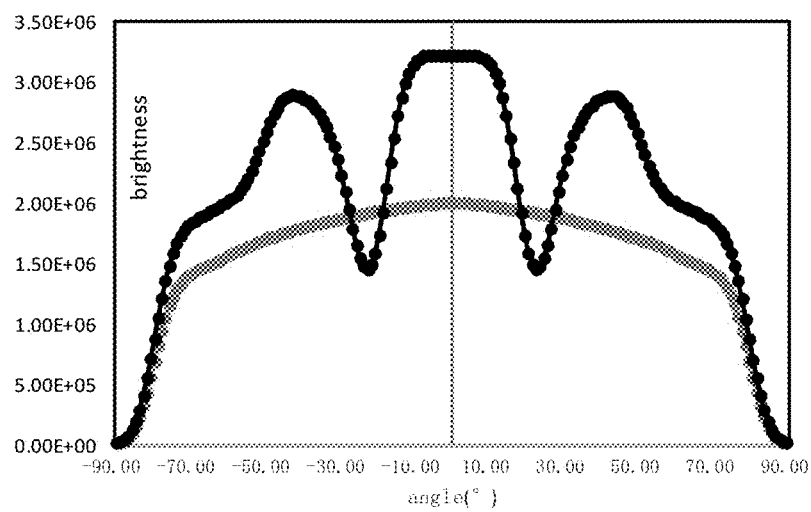
FIG. 9 shows comparison result of a brightness of the display panel of the present disclosure and a brightness of the display panel in the related art (line a is the brightness simulation result of the display panel of the present disclosure with the microlens; line b is the brightness simulation result of the display panel without the microlens).

According to an embodiment of the present disclosure, a display panel 10 having a plurality of the microlenses 200 has a display brightness that is significantly better than a display panel without the microlens 200. As shown in FIG. 9, in the plurality of second openings 310 in the display panel, it is assumed that the angle located on the left of the center line of the plurality of microlens 300 is a negative value, and the angle located on the right of the center line of the plurality of microlens 300 is a positive value, therefore, the angle of light emitted along the centerlines of the plurality of microlenses 300 is 0 degrees, the angle of light emitted perpendicular to the centerlines of the plurality of microlens 300 and is located to the left of the centerlines of the plurality of microlenses 300 is −90 degrees, and the angle of light that is perpendicular to the center lines of the plurality of microlens 300 and is located to the right of the center lines of the plurality of microlens 300 is 90 degrees. Therefore, the angles of light emitted on the left side of the centerlines of the plurality of microlens 300 are between −90 degrees and 0 degree, and the angles of light emitted on the right side of the centerline of the plurality of microlens 300 are between 0 degrees and 90 degrees. As can be seen from FIG. 9, light with an angle from −90 degrees to −30 degrees, an angle from −20 degrees to 20 degrees, an angle from 30 degrees to 90 degrees, their brightness in the presence of microlens 200 (line a in FIG. 9) is significantly higher than the brightness in the absence of microlens 200 (line b in FIG. 9); while light with an angle from −30 degrees to −20 degrees and an angle from 20 degrees to 30 degrees, their brightness in the presence of microlens 200 is slightly lower than that in the absence of microlens 200, the inventor believes that this is mainly caused by a certain gap between two adjacent microlens 300, but overall, the brightness of the display panel in the presence of microlens 200 is higher than that of the display panel in the absence of microlens 200. After extensive research, the inventor found that the brightness of the display panel in the presence of microlens 200 can be at least 1.6 times the brightness of the display panel in the absence of microlens 200. Therefore, the display panel of the present disclosure has high display brightness and good display effect.

Figure 15A:
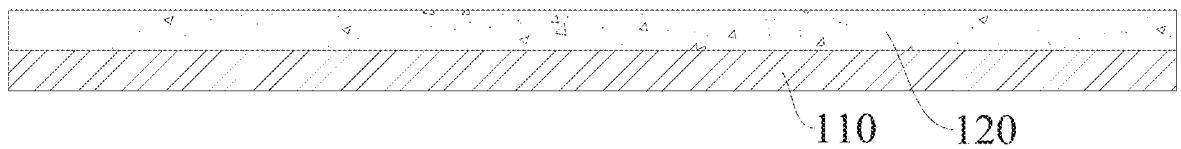
FIGS. 15a, 15b, 15c, 15d, 15e, 15f, and 15g show schematic flowcharts of a method for manufacturing a display panel according to a specific embodiment of the present disclosure.

In yet another aspect of the present disclosure, the present disclosure provides a method of manufacturing the aforementioned display panel. According to an embodiment of the present disclosure, the method includes the step of forming a display backboard. Referring to FIGS. 11 and 15a to 15d, the step of forming the display backboard includes the following steps:

S100, forming the thin film transistor array layer 120 on the surface of the base substrate 110 (referring to FIG. 15a for the structure diagram).

According to the embodiments of the present disclosure, the steps and processes for forming the thin film transistor array layer 120 may be conventional steps and processes for forming the thin film transistor array layer 120, which will not be repeated here. Thus, the manufacturing process is simple, convenient, easy to realize, and easy to industrialize.

Figure 15B:
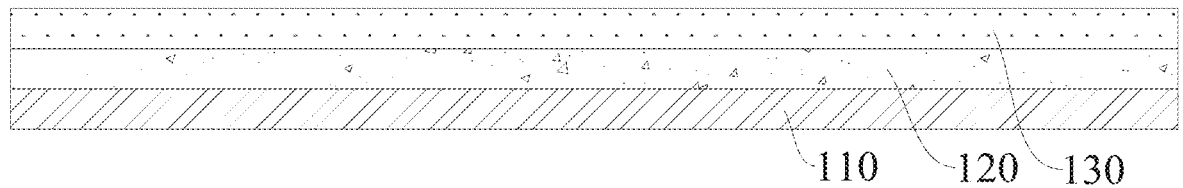

S200, forming the flattening layer 130 on the side of the thin film transistor array layer 120 away from the base substrate 110 (referring to FIG. 15b for the structure diagram).

According to an embodiment of the present disclosure, the process of forming the flattening layer 130 on the side of the thin film transistor array layer 120 away from the base substrate 110 may include vacuum evaporation, chemical vapor deposition, spin coating, and inkjet printing. The process parameters of vacuum vapor deposition, chemical vapor deposition, spin coating, and inkjet printing are all conventional vacuum vapor deposition, chemical vapor deposition, spin coating, and inkjet printing, which will not be repeated here. Thus, the manufacturing process is simple, convenient, easy to realize, and easy to industrialize.

Figure 15C:
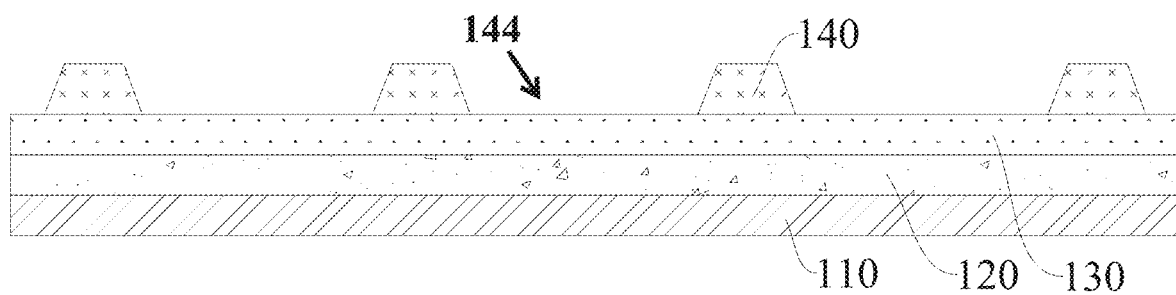

S300, forming the first pixel-defining layer 140 on the surface of the flattening layer 130 away from the base substrate 110, the first pixel-defining layer 140 defining the plurality of first openings 144 (referring to FIG. 15c for the structure diagram).

According to an embodiment of the present disclosure, the process of forming the first pixel-defining layer 140 on the surface of the flattening layer 130 away from the base substrate 110 may include vacuum evaporation, chemical vapor deposition, spin coating, and inkjet printing, etc., or it may be other conventional processes for forming a pixel-defining layer in the art. The process parameters of vacuum vapor deposition, chemical vapor deposition, spin coating, and inkjet printing are all conventional vacuum vapor deposition, chemical vapor deposition, spin coating, and inkjet printing, which will not be repeated here. Thus, the manufacturing process is simple, convenient, easy to realize, and easy to industrialize.

Figure 15D:
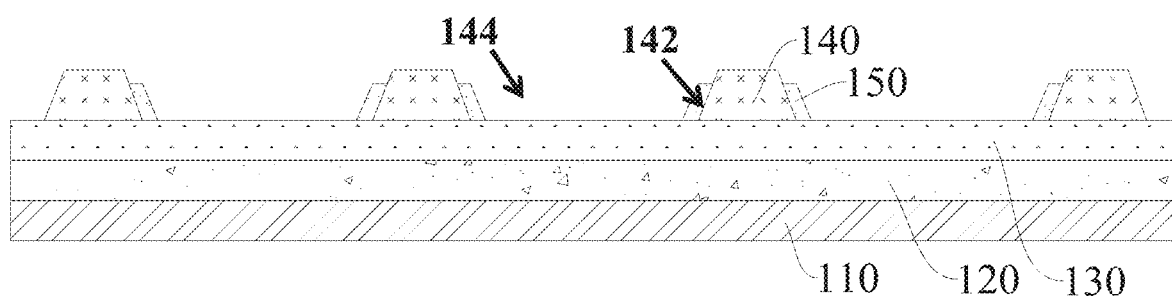

S400, forming the reflective layer 150 at least at the portion of the sidewall 142 of the first opening 144 (referring to FIG. 15d for the structure diagram).

According to an embodiment of the present disclosure, the process of forming the reflective layer 150 on at least the portion of the side wall 142 of the first openings 144 may include vacuum evaporation, chemical vapor deposition, spin coating, and inkjet printing, or it may be other conventional processes for forming pixel-defining layer in the field. The process parameters of vacuum vapor deposition, chemical vapor deposition, spin coating, and inkjet printing are all conventional vacuum vapor deposition, chemical vapor deposition, spin coating, and inkjet printing, which will not be repeated here. Thus, the manufacturing process is simple, convenient, easy to realize, and easy to industrialize.

Figure 12:
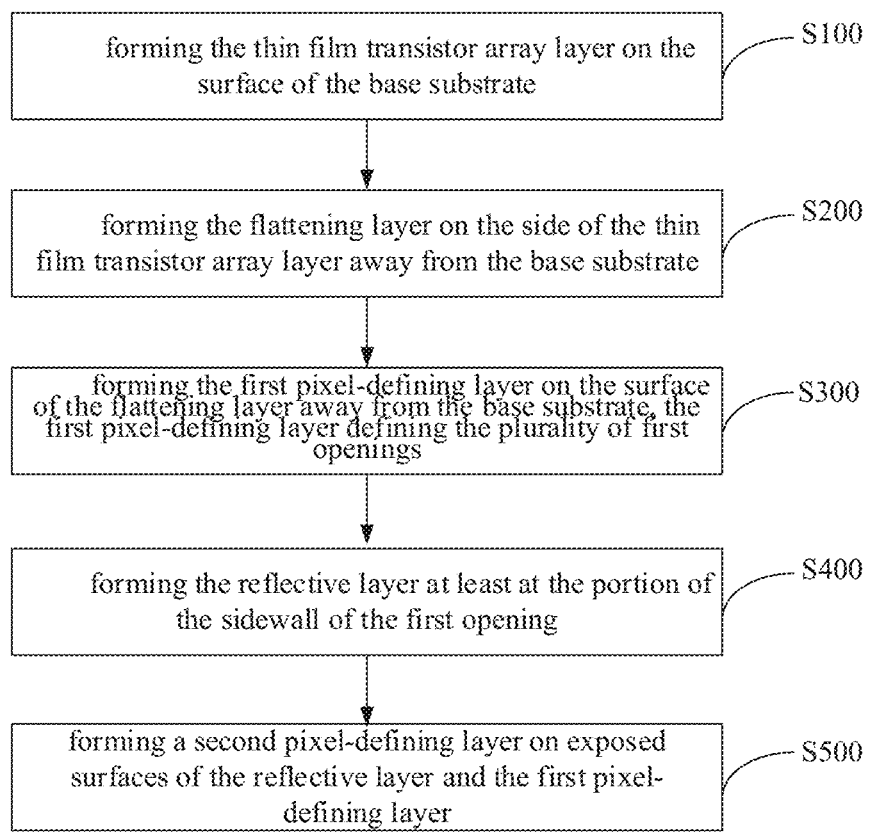
FIG. 12 shows a schematic flowchart of a method for manufacturing a display panel according to another embodiment of the present disclosure.
Figure 15E:
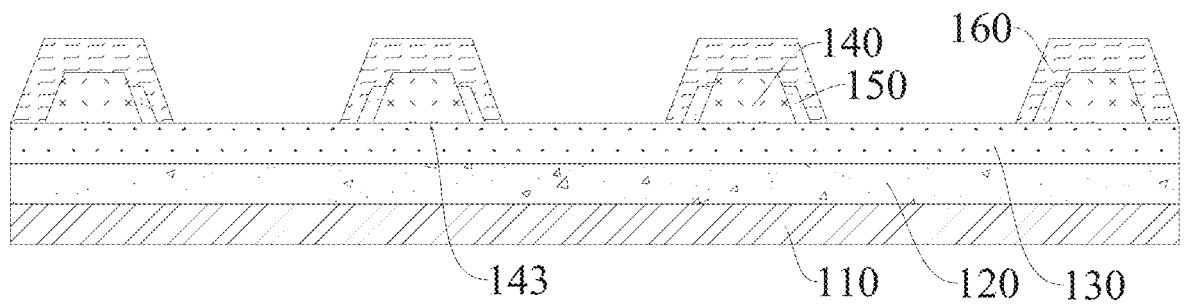

In some other embodiments of the present disclosure, referring to FIGS. 12 and 15e, the step of forming the display backboard further includes the following step:

S500, forming a second pixel-defining layer 160 on exposed surfaces of the reflective layer 150 and the first pixel-defining layer 140 (referring to FIG. 15e for the structure diagram).

According to an embodiment of the present disclosure, the process of forming a second pixel-defining layer 160 on exposed surfaces of the reflective layer 150 and the first pixel-defining layer 140 may include vacuum evaporation, chemical vapor deposition, spin coating, and inkjet printing, or it may be other conventional processes for forming pixel-defining layer in the field. The process parameters of vacuum vapor deposition, chemical vapor deposition, spin coating, and inkjet printing are all conventional vacuum vapor deposition, chemical vapor deposition, spin coating, and inkjet printing, which will not be repeated here. Thus, the manufacturing process is simple, convenient, easy to realize, and easy to industrialize.

Figure 13:
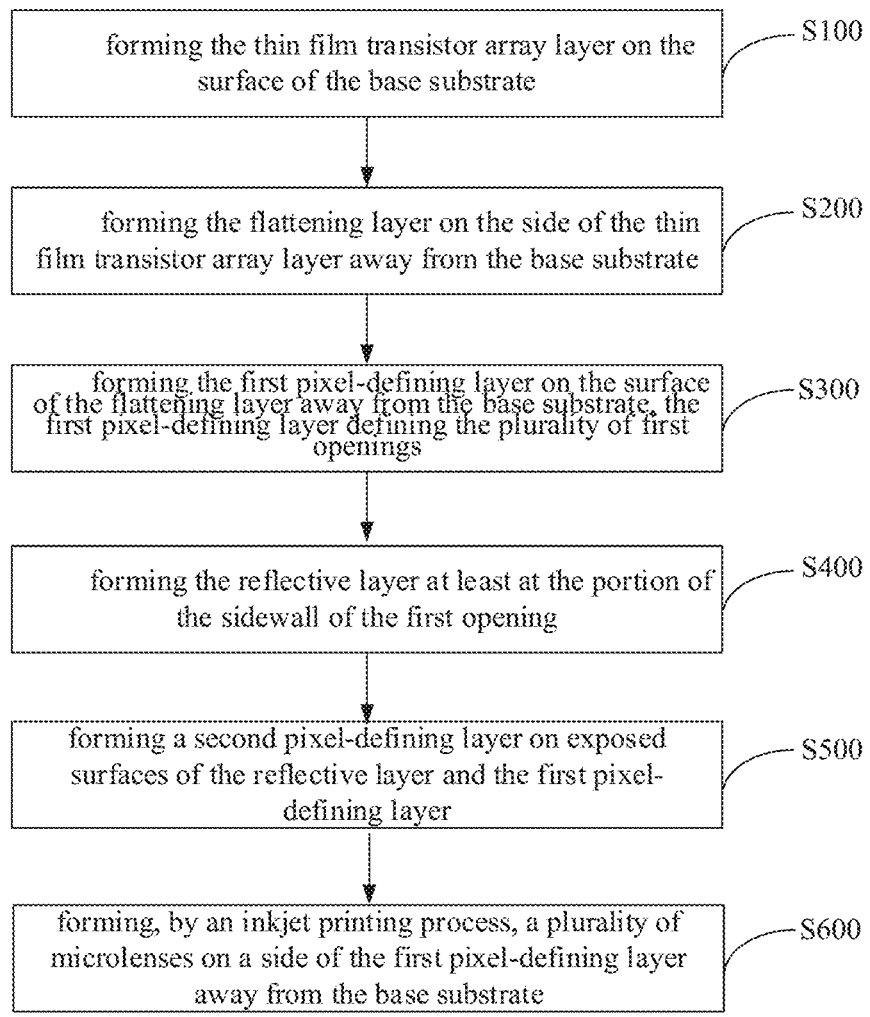
FIG. 13 shows a schematic flowchart of a method for manufacturing a display panel according to yet another embodiment of the present disclosure.
Figure 15F:
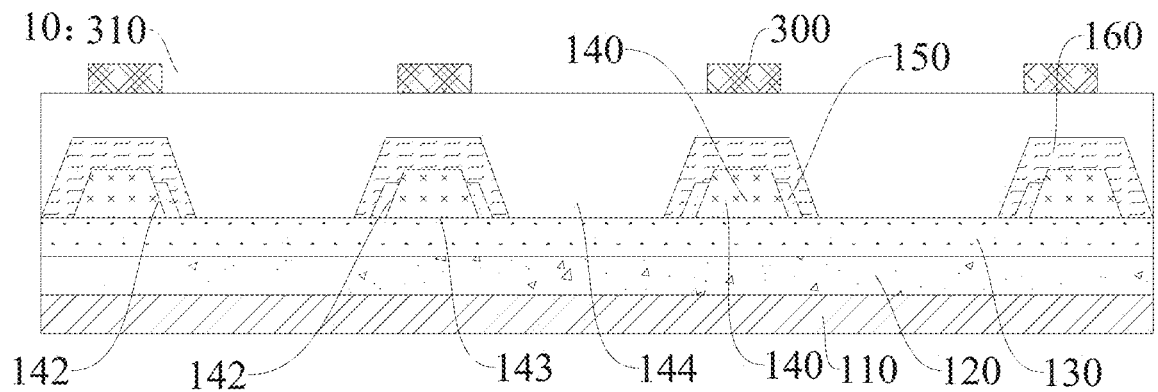
Figure 15G:
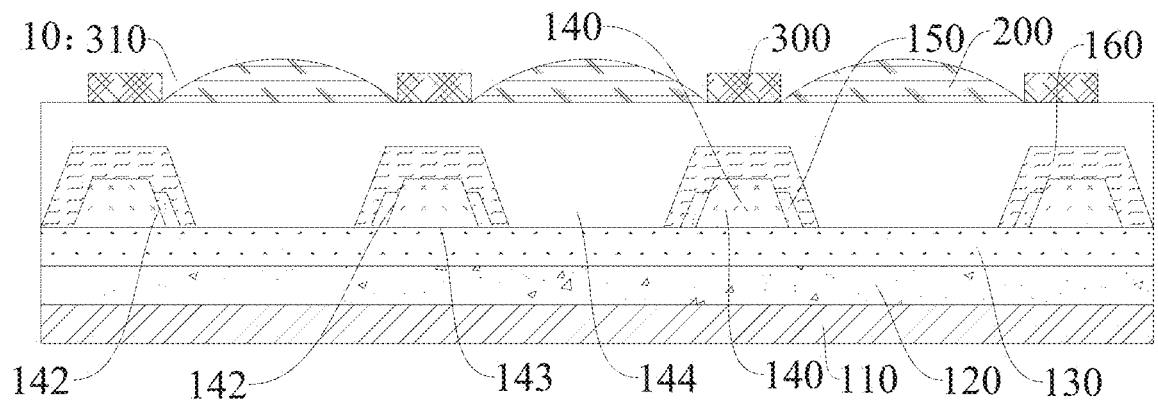

In still some other embodiments of the present disclosure, after forming the display backboard, referring to FIGS. 13 and 15g, the method further includes the following step:

S600, forming, by an inkjet printing process, a plurality of microlenses 200 on a side of the first pixel-defining layer 140 away from the base substrate 110 (referring to FIG. 15g for the structure diagram).

According to an embodiment of the present disclosure, after the microlens 200 is formed, since its surface away from the display backboard is a curved surface convex away from the display backboard, it has a converging effect on light, thereby making the display brightness of the positive viewing angle of the display panel is significantly improved.

Figure 14:
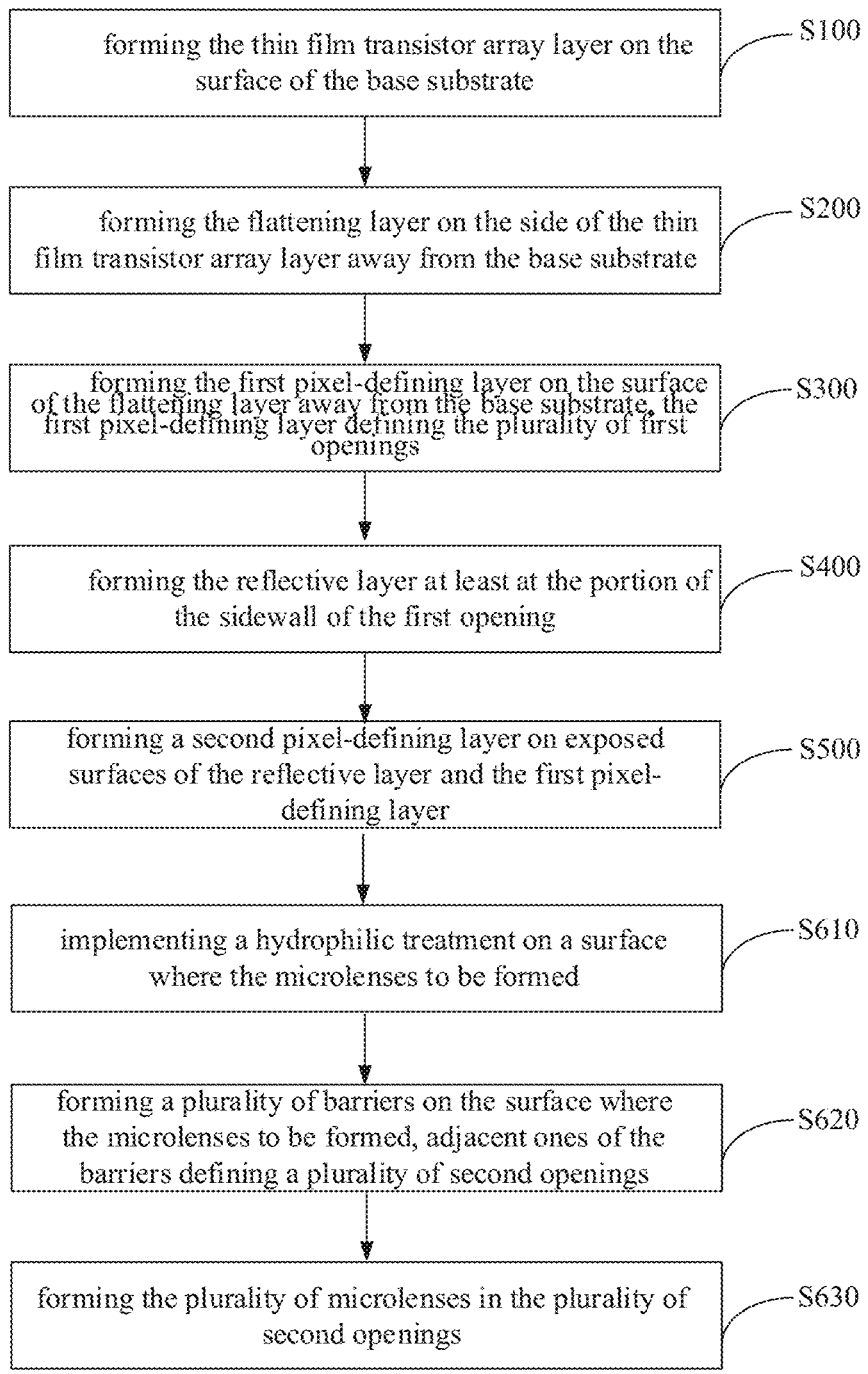
FIG. 14 shows a schematic flowchart of a method for manufacturing a display panel according to still another embodiment of the present disclosure.

In yet some other embodiments of the present disclosure, referring to FIGS. 14 and 15f, the step of forming t a plurality of microlenses 200 further includes: S610, implementing a hydrophilic treatment on a surface where the microlenses 200 to be formed.

Figure 16A:
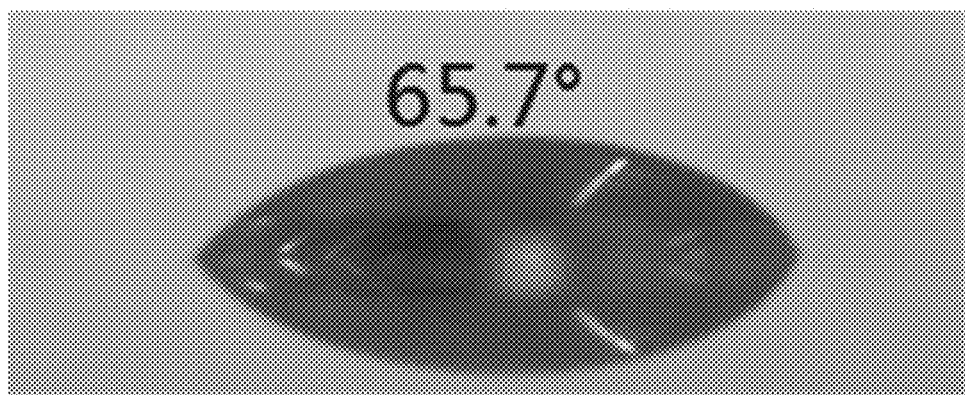
FIGS. 16a and 16b show the test results of the effect of an ashing treatment on the hydrophilicity according to embodiments of the present disclosure
Figure 16B:
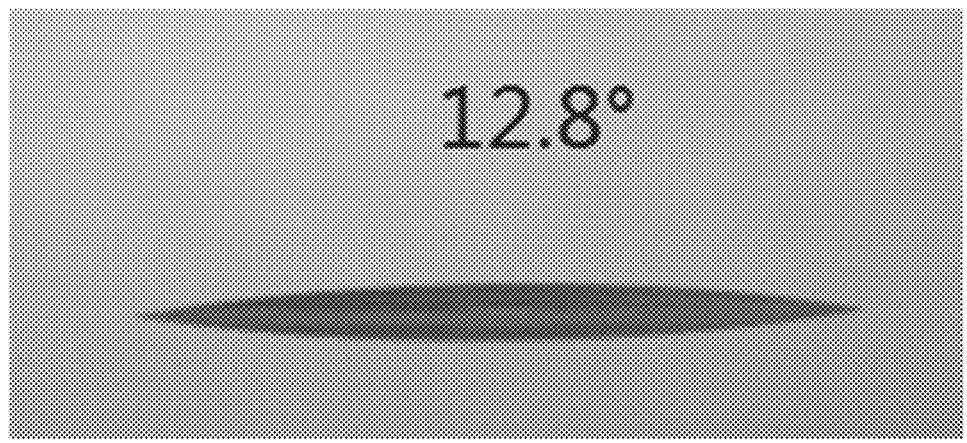

According to an embodiment of the present disclosure, the hydrophilic treatment may specifically be ashing treatment. Referring to FIGS. 16a and 16b, FIG. 16a is a contact angle test of the surface of the display backboard away from the base substrate 110 before the ashing process, the test result is 65.7 degrees; and after the ashing process, the contact angle of the surface of the display backboard away from the base substrate 110 is only 12.8 degrees. Thus, the ashing treatment can significantly increase the hydrophilicity of the aforementioned surface.

S620, forming a plurality of barriers 300 on the surface where the microlenses 200 to be formed, adjacent ones of the barriers 300 defining a plurality of second openings 310 (referring to FIG. 15f for the structure diagram).

According to an embodiment of the present disclosure, the process of forming a plurality of barriers 300 on the surface of the display backboard away from the base substrate 110 may include a patterning process. The patterning process includes providing a hydrophobic layer and coating a photoresist on the surface of the display backboard away from the base substrate 110, and then covering the surface of the hydrophobic layer with a mask, after that, exposure, development, etching, photoresist stripping and other steps are performed to form barriers 300. The specific process parameters of each step in the patterning process are process parameters of the conventional patterning process, and will not be described here. Thus, the manufacturing process is simple, convenient, easy to realize, and easy to industrialize.

According to an embodiment of the present disclosure, when the surface of the microlens 200 to be formed is subjected to hydrophilic treatment first, and then a plurality of barriers 300 are formed on the surface of the microlens 200 to be formed. First of all, since the surface is highly hydrophilic, while after forming a plurality of barriers 300, the surface of the barriers is relatively hydrophobic relative to the surface of the display backboard away from the base substrate 110. Therefore, when the microlens 200 is formed by inkjet printing as described above, facilitating the flow of ink droplets. The barriers 300 are highly hydrophobic, which facilitates the repulsion of ink droplets during inkjet printing, making it difficult for ink droplets to approach barriers 300 and to form the aforementioned curved surface. After the ink is cured, the microlens 200 described above can be effectively produced. Compared with the method of forming the microlens by the halftone mask process, the cost is lower. At the same time, the method described above can be performed at a low temperature without being affected by higher temperature, thereby it can realize the secondary processing directly on the display backboard, which is convenient to operate and easy to industrialize.

S630, forming the plurality of microlenses 200 in the plurality of second openings 310, respectively (referring to FIG. 15g for the structure diagram).

According to an embodiment of the present disclosure, the process of forming a plurality of the microlens is the same as described above, and will not be repeated here.

According to the embodiments of the present disclosure, in addition to the aforementioned structure, the manufacturing processes of other structures in the display panel may be conventional manufacturing processes in the art, which will not be repeated here.

In still another aspect of the present disclosure, the present disclosure provides a display apparatus. According to an embodiment of the present disclosure, the display apparatus includes the aforementioned display panel. The display apparatus has high display brightness and good display effect, and is particularly suitable for smaller size displays in the AR field.

According to the embodiments of the present disclosure, in addition to the aforementioned display backboard, the display apparatus includes other necessary structures and components. Those skilled in the art may supplement and design according to the specific types and use requirements of the display apparatus, which will not repeat here.

According to the embodiments of the present disclosure, the specific types of the display apparatus are not particularly limited, and include, but are not limited to, mobile phones, tablet computers, wearable devices, game consoles, and the like.

In the description of the present disclosure, it should be understood that the terms "first" and "second" are used for descriptive purposes only, and cannot be understood as indicating or implying relative importance or implicitly indicating the number of technical features indicated. Thus, the features defined as "first" and "second" may explicitly or implicitly include one or more of the features. In the description of the present disclosure, the meaning of "plurality" is two or more, unless otherwise specifically limited.

In the present disclosure, unless explicitly stated and defined otherwise, the first feature "above" or "below" the second feature may be that the first and second features are in direct contact, or that the first and second features are indirectly intermediary contact. Moreover, the first feature is "onto", "on" and "above" the second feature may be that the first feature is directly above or obliquely above the second feature, or simply means that the first feature is higher in level than the second feature. The first feature is "under", "below", and "underside" the second feature may be that the first feature is directly below or obliquely below the second feature, or simply means that the first feature is less horizontal than the second feature.

In the description of this specification, the description with reference to the terms "one embodiment", "some embodiments", "examples", "specific examples", or "some examples" means specific features, structures, materials or characteristics described in conjunction with the embodiments or examples are included in at least one embodiment or example of the present disclosure. In this specification, the schematic representation of the above terms does not necessarily refer to the same embodiment or example. Moreover, the specific features, structures, materials, or characteristics described may be combined in any suitable manner in any one or more embodiments or examples. In addition, without contradicting each other, those skilled in the art may combine and combine different embodiments or examples and features of different embodiments or examples described in this specification.

Although the embodiments of the present disclosure have been shown and described above, it is understood that the above-mentioned embodiments are exemplary and cannot be construed as limitations to the present disclosure, and those of ordinary skill in the art may change, modify, replace the embodiments.

What is claimed is:
1. A display panel, comprising a display backboard, wherein the display backboard comprises:
a base substrate, a thin film transistor array layer on a surface of the base substrate, a flattening layer on a side of the thin film transistor array layer away from the base substrate, and a pixel-defining layer on a surface of the flattening layer away from the base substrate,
wherein the pixel-defining layer comprises a first pixel-defining layer, the first pixel-defining layer defines a plurality of first openings, at least a portion of a sidewall of each first opening is provided with a reflective layer,
wherein the pixel-defining layer further comprises a second pixel-defining layer, the second pixel-defining layer is on exposed surfaces of the reflective layer and the first pixel-defining layer, and the second pixel-defining layer completely covers the exposed surfaces of the reflective layer and the first pixel-defining layer,
wherein the display panel further comprises:
a plurality of microlenses provided on a side of the first pixel-defining layer of the display backboard away from the base substrate, and surfaces of the plurality of microlenses away from the display backboard are a curved surface convex away from the display backboard, and an orthographic projection of at least one of the first openings on the base substrate at least partially overlaps with orthographic projections of the plurality of microlenses on the base substrate, and
a plurality of barriers provided on a side of the first pixel-defining layer away from the base substrate, adjacent ones of the barriers define a plurality of second openings, and the plurality of microlenses are provided in the plurality of second openings,
wherein a surface of the barriers is relatively hydrophobic relative to a surface of the display backboard away from the base substrate, and
wherein the display panel further comprises:
a packaging structure provided on the surface of the display backboard; and
a black matrix and a color resist layer, wherein the black matrix is disposed on a surface of the packaging structure away from the base substrate, the black matrix defines a plurality of third openings, the color resist layer is disposed in the plurality of third openings, and orthographic projections of the third openings on the base substrate at least partially overlap with orthographic projections of the first openings on the base substrate.

2. The display panel according to claim 1, wherein at least one of the microlenses meets at least one of the following conditions:

$$f = \frac{n_1 r}{n_2 - n_3} \text{ and } r = \frac{f*(n_2 - n_3)}{n_1};$$

$$n_3 = n_2 - \frac{r*n_1}{f} \text{ and } n_2 - n_3 = \frac{r*n_1}{f};$$

$$\Delta n = \frac{r*n_1}{f};$$

$$r \geq \frac{D}{2};$$

$$\Delta n = \frac{r*n_1}{f} \geq \frac{n_1 * D}{2f},$$

where, f is a focal length of the microlens, $n_1$ is an average refractive index of all structures on a side of the microlens close to the display backboard, and $n_2$ is a refractive index of a material forming the microlens, $n_3$ is a refractive index of a structure on a surface of the microlens away from the display backboard, r is a curvature radius of the curved surface, D is a caliber of the microlens, and $\Delta n$ is a difference between $n_2$ and $n_3$.

3. A method of manufacturing the display panel according to claim 1, the method comprising a step of forming the display backboard, wherein the step of forming the display backboard comprises:

forming the thin film transistor array layer on a surface of the base substrate;

forming the flattening layer on the side of the thin film transistor array layer away from the base substrate;

forming the first pixel-defining layer on the surface of the flattening layer away from the base substrate, the first pixel-defining layer defining the plurality of first openings; and forming the reflective layer at least at a portion of the sidewall of each first opening.

4. The method according to claim 3, wherein the step of forming the display backboard further comprises:

forming the second pixel-defining layer on exposed surfaces of the reflective layer and the first pixel-defining layer.

5. The method according to claim 3, wherein after the step of forming the display backboard, the method further comprises:

forming, by an inkjet printing process, a plurality of microlenses on a side of the first pixel-defining layer away from the base substrate.

6. The method according to claim 5, wherein the step of forming a plurality of microlenses further comprises:

implementing a hydrophilic treatment on a surface where the microlenses to be formed;

forming a plurality of barriers on the surface where the microlenses to be formed, adjacent ones of the barriers defining a plurality of second openings; and forming the plurality of microlenses in the plurality of second openings, respectively.

7. The method according to claim 6, wherein the hydrophilic treatment comprises an aching treatment.

8. A display apparatus comprising the display panel according to claim 1.

9. The display panel according to claim 1, wherein the entire sidewall of each first opening is provided with the reflective layer.

10. The display panel according to claim 9, wherein a surface of the first pixel-defining layer away from the base substrate is also provided with the reflective layer.

11. The display panel according to claim 1, wherein the reflective layer meets at least one of the following conditions:

a material forming the reflective layer comprises at least one of silver, aluminum, and magnesium; and a thickness is 0.1 μm~1 μm.

* * * * *